US008082528B2

(12) United States Patent
Kim (10) Patent No.: US 8,082,528 B2
(45) Date of Patent: Dec. 20, 2011

(54) PROCESS-INDEPENDENT SCHEMA LIBRARY

(75) Inventor: Jaeha Kim, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 341 days.

(21) Appl. No.: 12/487,595

(22) Filed: Jun. 18, 2009

(65) Prior Publication Data
US 2010/0031204 A1  Feb. 4, 2010

Related U.S. Application Data

(60) Provisional application No. 61/084,562, filed on Jul. 29, 2008.

(51) Int. Cl.
*G06F 17/50* (2006.01)

(52) U.S. Cl. ........ 716/103; 716/100; 716/101; 716/102; 716/104; 703/13; 703/14; 707/641; 707/642

(58) Field of Classification Search .......... 716/100–104; 703/13–22; 707/641–642
See application file for complete search history.

(56) References Cited

U.S. PATENT DOCUMENTS

| | | | |
|---|---|---|---|
| 6,760,900 B2 | 7/2004 | Rategh et al. | |
| 7,483,825 B2 * | 1/2009 | Van Huben et al. | 703/16 |
| 7,587,693 B2 * | 9/2009 | Ooshima | 716/113 |
| 7,702,616 B1 * | 4/2010 | Li et al. | 707/999.002 |
| 7,725,886 B2 * | 5/2010 | Kunze et al. | 717/159 |
| 2008/0086711 A1 * | 4/2008 | Ito | 716/12 |

OTHER PUBLICATIONS

"Schematic Porting," from an online discussion forum: http://www.groupsrv.com/computers/about271536.html (retrieved on Feb. 7, 2008), 5 pages.
"Process Independent Netlisting from ADE," http://newsgroups.derkeiler.com/Archive/Comp/comp.cad.cadence/2005-10/msg00001.html (retrieved on Feb. 7, 2008), 12 pages.
Liu, Dean; Sidiropoulos, Stefanos; Horowiitz, Mark, "A Framework for Designing Reusable Analog Circuits," ICCAD, 2003 International Conference on Computer-Aided Design (ICCAD '03), 2003, 6 pages.
Dunn, Roy, "On Scalable Design Rules vs. Rule Based Compilation/Compaction," Processing Issues for VLSI/ASIC Designers, IEEE Colloquium, publication date: Jun. 22, 1992, pp. 6/1-6/5.
"MOSIS Scalable CMOS (SCMOS) Design Rules, Revision 8.00," updated Oct. 4, 2004, 16 pages.

* cited by examiner

*Primary Examiner* — Nghia Doan
(74) *Attorney, Agent, or Firm* — Hickman Palermo Truong & Becker LLP (57) ABSTRACT

Methods are provided for utilizing a process-independent schema library that contains all the devices and all the device parameters in each of various process-specific schema libraries that a user or a group of users is working with. A process-specific schematic based on a first process technology can be converted to a process-specific schematic based on a second process technology by being first converted to a process-independent schematic that is based on the process-independent schema library, which is then converted to the process-specific schematic based on the second process technology. Circuits can be also be stored as a process-independent schematic that is based on the process-independent schema library but designed using a user interface that displays process-specific devices and device parameters.

24 Claims, 4 Drawing Sheets

| PROCESS 1 SPECIFIC SCHEMA CELL (IN LIBRARY) 204 | PROCESS 2 SPECIFIC SCHEMA CELL (IN LIBRARY) 206 |
|---|---|
| W, L, M, bodycontact | W, L, M, NF |

∪ ∪

| PROCESS INDEPENDENT SCHEMA CELL (IN LIBRARY) 200 |
|---|
| W, L, M, NF, bodycontact, ... |

# PROCESS-INDEPENDENT SCHEMA LIBRARY

PRIORITY CLAIMS AND RELATED APPLICATIONS

This application claims domestic priority from prior U.S. Provisional Patent Application Ser. No. 61/084,562, filed on 29 Jul. 2008, "PROCESS-INDEPENDENT SCHEMA LIBRARY," the entire disclosure of which is hereby incorporated by reference for all purposes as if fully set forth herein.

FIELD OF THE INVENTION

The present invention relates to schematic design for analog circuits.

BACKGROUND

In analog circuit design, it is advantageous to be able to port circuit schematics designed for one project to another project in order to reduce redesign time and to increase design reuse. An analog circuit schematic, however, is usually designed using an analog circuit design entry program based on a single specific process technology. Since many different process technologies are available from a multitude of integrated-circuit (IC) foundries, porting an analog circuit schematic usually requires converting a schematic that was designed based on one specific process technology into a schematic that is based on another specific process technology. This conversion process is time-consuming and may involve manually redrawing the circuit schematic, thereby adding time and cost associated with reusing circuit designs.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

In the following description, the words "device" and "cell" are used interchangeably. Both a "device" and a "cell" refer to a building block stored in a schema library that represents a physical circuit device, such as an NMOS transistor or a PMOS transistor. This "device" or "cell" may be used in circuit schematics to represent the physical circuit device.

Overview

Techniques are described in which an analog circuit design entry program uses a process-independent schema library that contains all the devices and all the device parameters of each of the various process-specific schema libraries that a user or a group of users is working with.

According to one embodiment, to convert a process-specific schematic based on a first process technology to a process-specific schematic based on a second process technology, the process-specific schematic based on a first process technology is first converted to a process-independent schematic that is based on the process-independent schema library, which is then converted to the process-specific schematic based on the second process technology.

According to another embodiment, circuits are designed using an analog circuit design entry program that displays, via a user interface, process-specific devices and device parameters. The analog circuit design entry program, in this embodiment, stores a designed circuit schematic as a process-independent schematic, which is based on the process-independent schema library. In addition, a stored process-independent schematic may be displayed in any process-specific design user interface. When displaying a stored process-independent schematic, the analog circuit design entry program dynamically converts between process-independent devices and device parameters and process-specific devices and device parameters. Storing circuit schematics in a process-independent format results in a shared repository of circuit designs. Users can work with the shared circuit schematics through their own process-specific user interface, and are thus able to fully design with any process technology.

Process Independent Schema Library

As mentioned above, in one embodiment, an analog circuit design entry program uses a process-independent schema library that is not associated with any particular process technologies, but includes devices and device parameters that correspond to the devices and device parameters in the process-specific schema libraries that are associated with the set of process technologies that a circuit designer (or a group of circuit designers) is working with. Devices and device parameters in the process-independent schema library are referred to as shadow devices and shadow device parameters. That is, the shadow devices and shadow device parameters in the process-independent schema library is likely a superset of the set of devices and device parameters in any particular process-specific library.

Figure 1:
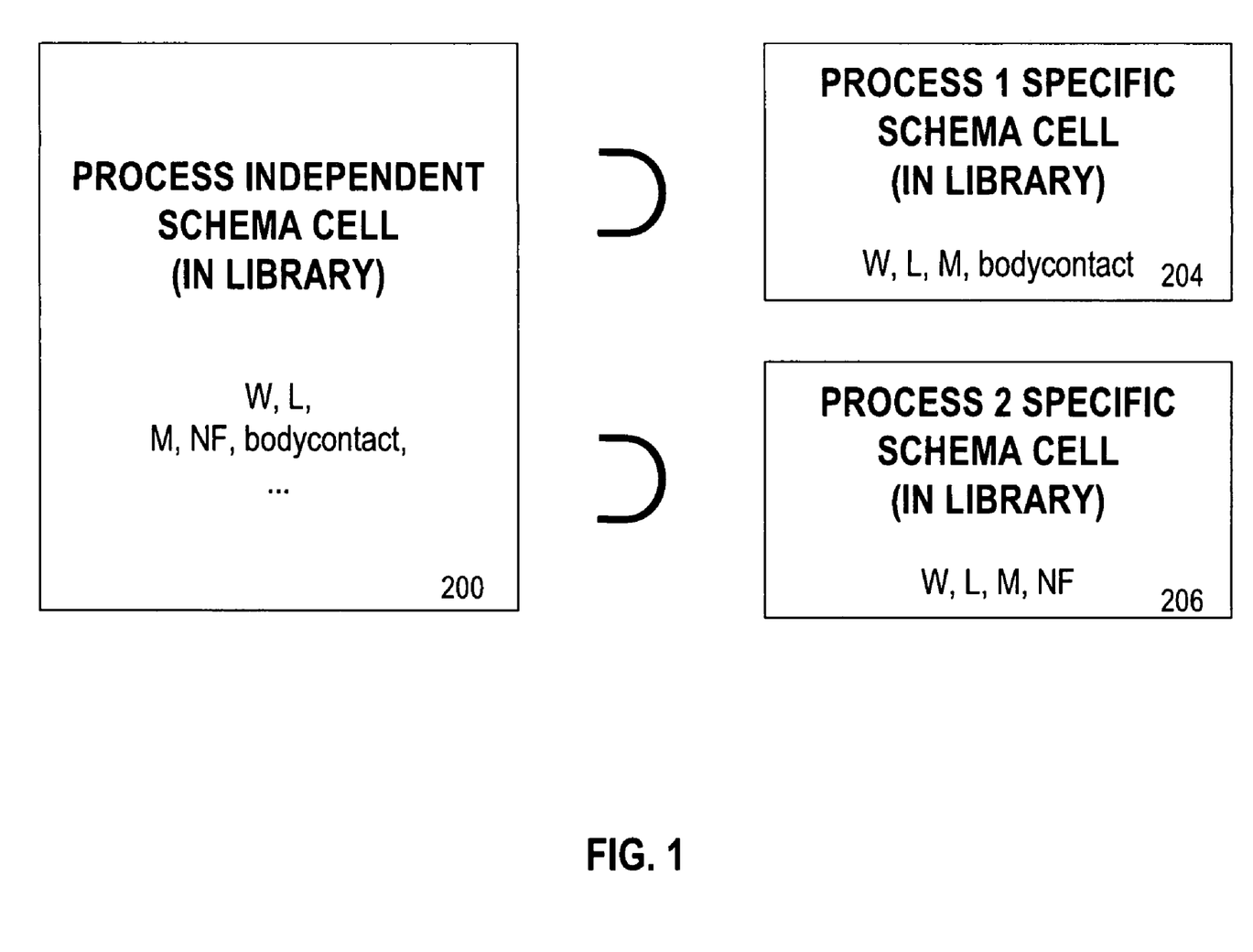
FIG. 1 is a diagram that illustrates how device parameters in two process-specific schema cells correspond to device parameters in a process-independent schema cell.

FIG. 1 is a diagram that illustrates how device parameters in two process-specific schema cells correspond to shadow device parameters in a process-independent schema cell. In FIG. 1, cell 200 is a cell, or device, in the process-independent schema library. Cell 204 is a cell, or device, in the process-specific schema library for Process 1, and cell 206 is a cell, or device, in the process-specific schema library for Process 2. Cell 200 corresponds to both cell 204 and cell 206. For example, cells 200, 204, and 206 may all represent a basic NMOS transistor. As FIG. 1 illustrates, cell 204 has four device parameters: W, L, M, and bodycontact. Cell 206 also has four device parameters: W, L, M, NF. Although three of the four device parameters in cells 204 and 206 are common (i.e., W, L, M), each of cell 204 and cell 206 contains a device parameter that is specific to the cell (i.e., bodycontact for cell 204 and NF for cell 206).

Cell 200 is the cell within the process-independent library that corresponds to both cell 204 and to cell 206. Consequently, cell 200 contains shadow device parameters that correspond to all the device parameters of the corresponding cells 204 and 206 in the process-specific libraries. Therefore, as FIG. 1 illustrates, cell 200 contains the shadow device parameters that correspond to common device parameters W, L, and M, as well as shadow device parameters that correspond to the process-specific parameters of bodycontact (specific to Process 1 only) and NF (specific to Process 2 only). Furthermore, cell 200 may contain additional shadow device parameters that do not correspond to any device parameters in either cell 204 or cell 206. The additional shadow device parameters in cell 200 may instead correspond to device parameters in cells in process-specific schema libraries for process technologies other than Process 1 or Process 2 (e.g., Process 3, Process 4, etc.).

FIG. 1 illustrates the correspondence between device parameters for a particular cell, or device, in process-independent and process-specific schema libraries. Analogously, a process-independent library contains cells, or shadow devices, that correspond to cells or devices contained in the process-specific schema libraries. For example, if the process-specific schema library for Process 1 contains cells A, B, C, and D, and if the process-specific schema library for Process 2 contains cells A, B, C, and E, then the process-independent schema library would contain cells, or shadow devices, that correspond to A, B, C, D, and E.

With regard to the example illustrated in FIG. 1, a cell in a "generic" schema library contains device parameters that correspond to W, L, and M, but no device parameters that correspond to bodycontact and NF. In one embodiment, a cell in the process-independent library contains a set of device parameters that corresponds to at least all the device parameters for the corresponding cell in any process-specific library. Therefore, a schematic that is represented with devices and device parameters from the process-independent library can include all the devices and device parameters available from any process-specific schematic. As such, a circuit designer using a process-independent library would not be restricted to a "generic" set of devices and device parameters that are common to all the process-specific libraries being used by the circuit designer.

The shadow devices and shadow parameters in the process-independent schema library need not be identified with the same name as corresponding devices and device parameters in process-specific schema libraries. Shadow device parameters in the process-independent schema may also be in units other than the units used for corresponding device parameters in process-specific schema libraries. A process-independent schematic, therefore, would contain shadow devices and shadow parameters from the process-independent schema library, where the values of the shadow parameters may be specified in units used in the process-independent schema library. For example, a process-independent schematic may contain a shadow device named "NMOS_t", which has a shadow device parameter value of 3 lambda for the "NMOS_w" shadow device parameter, that corresponds to a device named "tonmos" with a device parameter value of 0.9 micron for the "w" device parameter in one process-specific schematic, and which may also correspond to a device named "nmos:tox" with a device parameter value of 6 contacts for the "width" device parameter in another process-specific schematic.

Converting Between Circuit Schematics

According to one embodiment, to convert a process-specific schematic based on a first process technology to a process-specific schematic based on a second process technology, the process-specific schematic based on a first process technology is first converted to a process-independent schematic that is based on the process-independent schema library, which is then converted to the process-specific schematic based on the second process technology. The conversions are performed according to mapping instructions that are stored in configuration files. This conversion process, in an embodiment, results in a much reduced number of configuration files for any circuit designer or group of circuit designers that work with four or more different process technologies.

Figure 2:
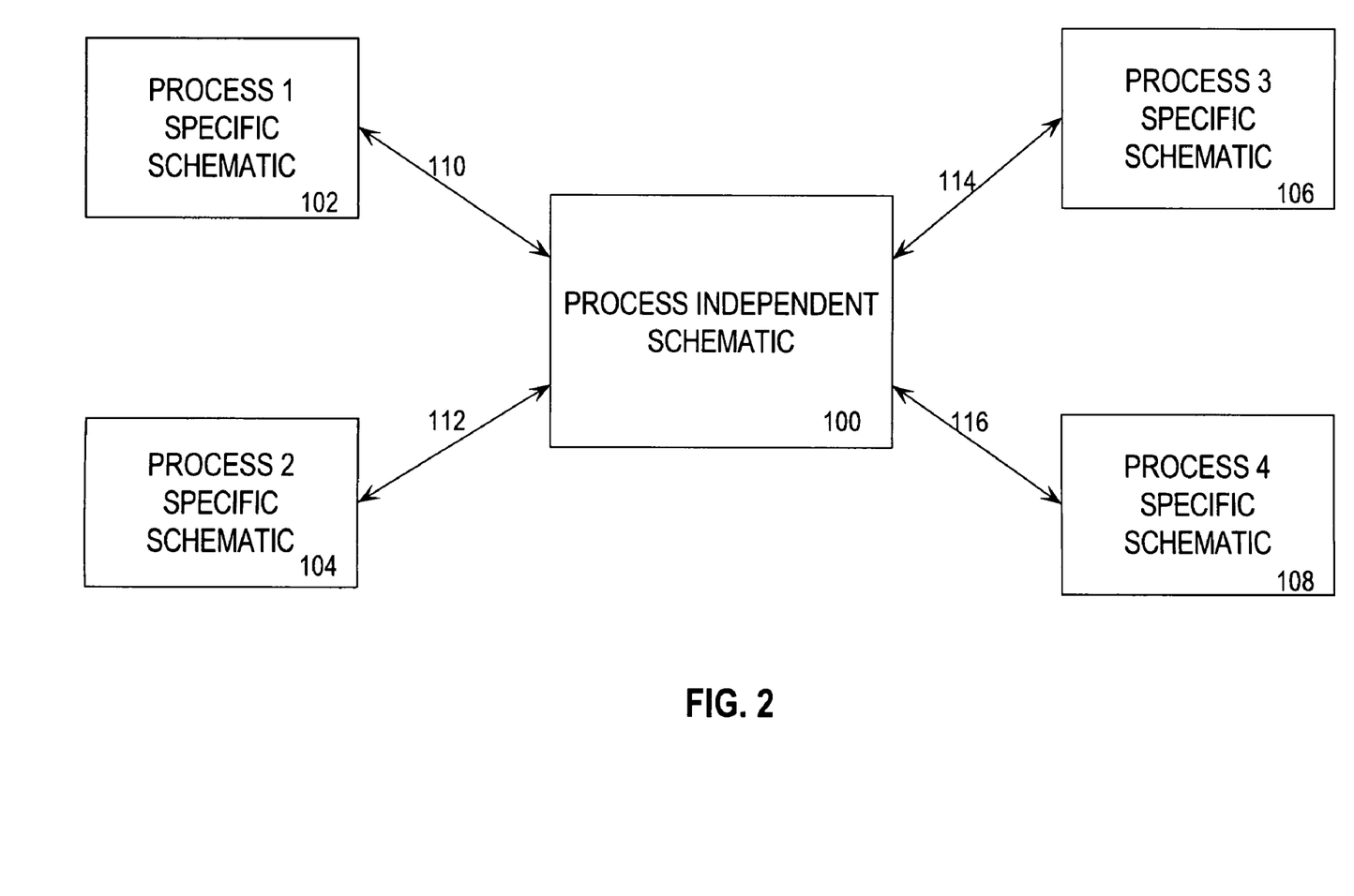
FIG. 2 is a diagram that illustrates how a process-independent schematic can be used as an intermediary in converting between two process-specific schematics.

FIG. 2 is a diagram that illustrates how a process-independent schematic can be used as an intermediary in converting between two process-specific schematics. In FIG. 2, schematic 100 is a process independent schematic that is based on a process-independent schema library. Schematic 102 is a schematic that is specific to Process 1 and is based on a schema library for Process 1. Similarly, schematics 104, 106, and 108 are schematics that are specific to Processes 2, 3, and 4, respectively, and are based on schema libraries for Processes 2, 3, and 4, respectively. The process-independent schema library upon which schematic 100 is based contains all the devices and device parameters in the schema libraries specific to Processes 1, 2, 3, and 4.

As illustrated in FIG. 2, a schematic specific to one process may be converted to a schematic specific to another process by first converting the schematic specific to the one process to a process-independent schematic. For example, schematic 102 is converted to schematic 100 based on configuration file 110. Next, schematic 100 is converted to schematic 106 based on configuration file 114. Similar conversions can be performed through using configuration files 112 and 116 such that any process-specific schematic (e.g., schematics 102, 104, 106, and 108) may be converted to any other process-specific schematic (e.g., schematics 102, 104, 106, and 108) by converting to a process-independent schematic (e.g., schematic 100) and then converting from the process-independent schematic to the desired process-specific schematic.

Each of the configuration files illustrated in FIG. 2 is used to perform two conversions: one from a process-independent schematic to a process-specific schematic, and one from a process-specific schematic to a process-independent schematic. In other words, each of the configuration files in FIG. 2 provides two conversion mappings. In FIG. 2, a total of eight configuration mappings are provided by the four configuration files. If, however, the conversions are performed directly among the four process-specific schematics without first converting to the process-independent schematic, there need be two conversion mappings between each unique pair of process-specific schematics, resulting in a total of twelve conversion mappings. In general, for N number of different process technologies, N*(N−1) conversion mappings are needed to directly convert between any schematic specific to a process technology to another schematic specific to another process technology. In contrast, if process-specific schematics may be first converted to a process-independent schematic, as illustrated in FIG. 2, then only a total of 2*N conversion mappings are needed. Therefore, by utilizing a process-independent schema library and an intermediate process-independent schematic, the number of configuration files that provide conversion mappings that need be written is significantly reduced.

Conversions may also be performed to convert a process-specific schematic to a process-independent schematic without performing a second conversion from the process-independent schematic to another process-specific schematic.

Configuration Files

A configuration file is a file that describes how devices and device parameters from one schema library are mapped to devices and device parameters in a different schema library, and is used to convert a schematic based on one schema library to a schematic based on a different schema library. Which devices map, or correspond, to each other is determined by the writer of the configuration file. The writer of a configuration file that maps devices and device parameters from a schema library for a first process technology to devices and device parameters from a schema library for a second process technology examines the schema libraries of a first process technology and a second process technology to find corresponding devices. In some cases, however, there may not be any corresponding device parameter in the second process technology for a particular device parameter in the first process technology.

Parameter Value Conversions

Once corresponding device parameters are mapped, the value for the device parameters specified in the schematic for the first process technology is converted to a value for the corresponding device parameter in the schematic for the second process technology. In some cases, this conversion comprises scaling the first value to a new value. For example, a value of 0.5 micron may be scaled by a factor of 2 to a value of 1.0 micron. In other cases, if the corresponding device parameters for the second process technology can contain only certain discrete values, then the first value may be "snapped" to the closest discrete value. For example, if the corresponding device parameter can only be 0.4 micron, 0.8 micron, or 1.2 micron, then the first value of 0.5 micron may be "snapped" to 0.4 micron.

Converting Schematics

According to one embodiment, conversions are performed to convert process-specific schematics to process-independent schematics, and vice versa. When a process-specific schematic is converted to a process-independent schematic, all the devices and device parameters in the process-specific schematic can be mapped to corresponding shadow devices and shadow device parameters in the process-independent schema library to generate the process-independent schematic.

When a process-independent schematic is converted to a process-specific schematic, however, there may be some shadow devices and/or shadow device parameters in the process-independent schematic that do not correspond to any devices and/or device parameters in the process-specific schema library. In such cases, the process-specific schematic that results from the conversion will contain less devices and/or device parameters than those in the process-independent schematic. Even so, converting schematics by first converting to a process-independent schematic preserves more devices and/or device parameters across different process technologies than the method where schematics are designed to include only the "generic", or common, devices and device parameters.

For example, the schema libraries for Processes 1 and 2 may both contain device parameter Z for device X, whereas the schema library for Process 3 does not contain device parameter Z for device X. If schematics can only contain devices and device parameters common to all the process technologies, then parameter Z may not be used. In contrast, in the present invention, schematics for Processes 1 and 2 may utilize device parameter Z. Even though converting a schematic for Process 1 to a schematic for Process 3 will result in parameter Z not being replicated in the schematic for Process 3, converting a schematic for Process 1 to a schematic for Process 2 will preserve parameter Z, thereby allowing parameter Z to be utilized in as many schematics and for as many process technologies as possible.

Displaying Process-Specific Schematics from Process-Independent Schematics

According to one embodiment, circuits are designed using a user interface that displays process-specific devices and device parameters, but the circuit schematic that is designed is stored as a process-independent schematic that is based on the process-independent schema library. In addition, a stored process-independent schematic may be displayed in any process-specific design user interface.

Figure 3:
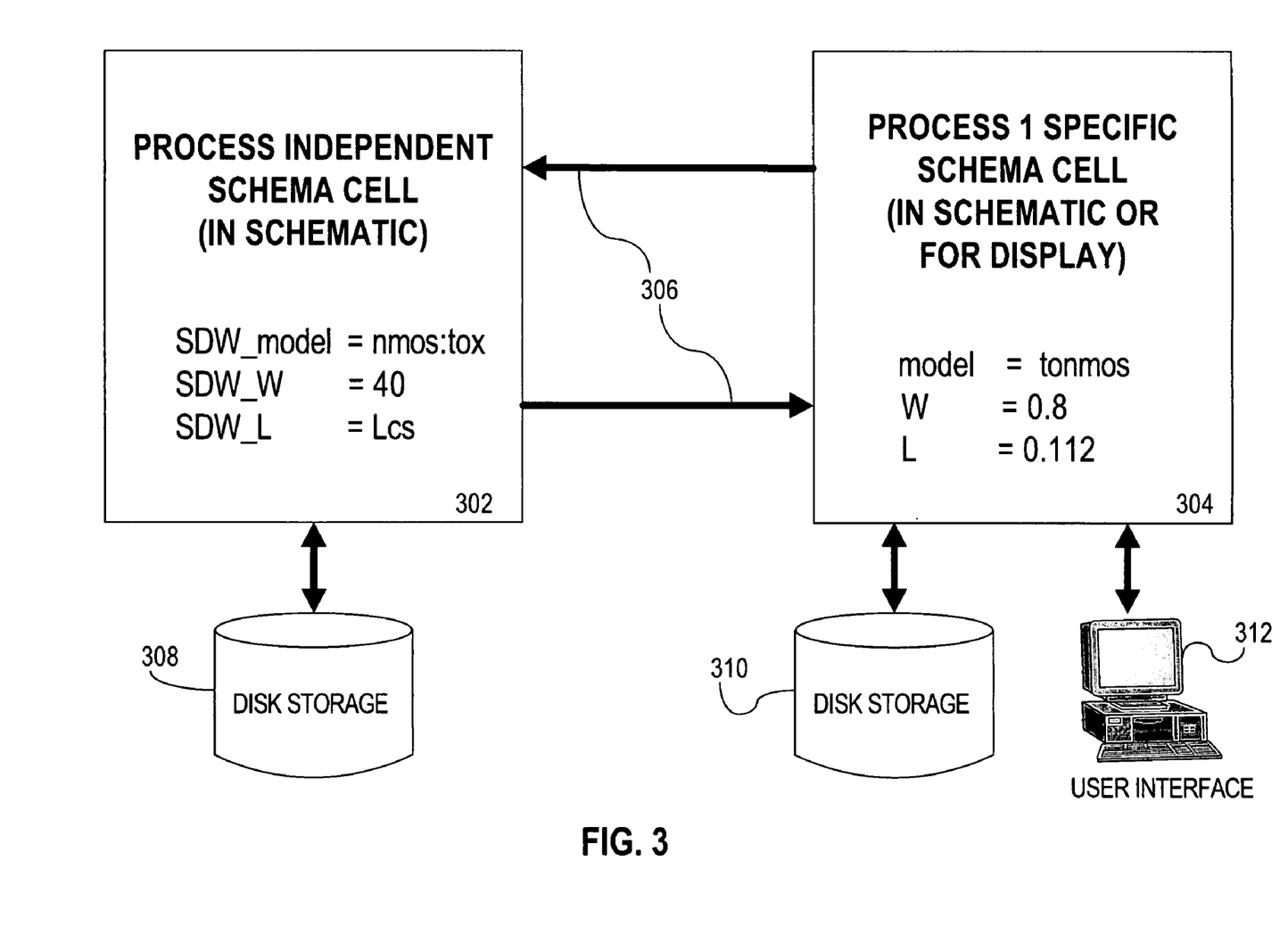
FIG. 3 is a diagram that illustrates conversions between a process-independent schema cell and a process-specific schema cell that can be displayed in a user interface.

FIG. 3 is a diagram that illustrates how a process-independent schema cell, in a process-independent schematic, can be displayed in a user interface as a process-specific schema cell as part of a process-specific schematic. Process-independent schema cell 302 is part of a process-independent schematic, and is stored on disk 308. Process-independent schema cell may also be referred to as a shadow device. Process-specific schema 304 corresponds to process-independent schema cell 302. Process-independent schema cell 302 contains shadow device parameters SDW_model, SDW_W, and SDW_L. These shadow device parameters correspond to the device parameters of model, W, and L in process-specific schema cell 304. Process-specific schema cell 304 may be displayed on user interface 312. In addition, process-specific schema cell 304 may also be stored on disk, such as on disk 310. Configuration file 306 is used to convert process-specific schema cell 304 to process-independent cell 302, and vice versa.

According to one embodiment, process-specific schema cell 304 is not stored to disk at all. Instead, process-specific schema cell 304 is stored only in volatile memory, to facilitate the display on user interface 312 of the device parameter values in process-specific schema 304. Thus, the device parameters of process-specific schema cell 304 is also referred to as display device parameters, and the values of the device parameters are also referred to as display device parameter values. As a result, a circuit designer who is interacting with user interface 312 will see a schematic that looks like a process-specific schematic, with process-specific device parameters. For example, a circuit designer will see on user interface 312 the values of tonmos, 0.8, and 0.112 associated with process-specific schema cell. However, process-specific schema cell 304 is not actually stored on disk. Rather, when a circuit designer decides to save the schematic that includes process-specific schema cell 304, configuration file 306 is used to convert the schematic to a process-independent schematic and saves that to disk. In FIG. 3, this conversion involves the conversion of process-specific schema cell 304 to process-independent schema cell 302.

When a circuit designer wishes to access a saved process-independent schematic, be may specify in what process technology the process-independent schematic should be displayed in. For example, in FIG. 3, a circuit designer may wish to access a process-independent schematic that includes process-independent schema cell 302 in Process 1. Configuration file 306 is used to convert the process-independent schematic to a process-specific schematic for Process 1, which includes converting process-independent schema cell 302 to process-specific schema cell 304. The process-specific schematic, including process-specific schema cell 304, will then be displayed on user interface 312.

Conversions may also be performed dynamically between process-independent devices and shadow device parameters and process-specific devices and display device parameters while a circuit designer is interacting with user interface 312. For example, user interface 312 may only display, for each process-specific schema cell, or display device, only three display parameter values, and a circuit designer wishes to view all the display parameter values for the process-specific schema cell 304. In this case, configuration file 306 is used to dynamically convert the remainder of the shadow device parameter values in process-independent schema cell 302 to display device parameters, and the display device parameters may then be displayed to the circuit designer on user interface 312.

Storing circuit schematics in a process-independent format results in a shared repository of circuit designs, without regards to any specific process. At the same time, users work with circuit schematic through a process-specific user interface and are thus able to fully design with any process technology. As a result, circuit designs can be easily shared and reused.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 4:
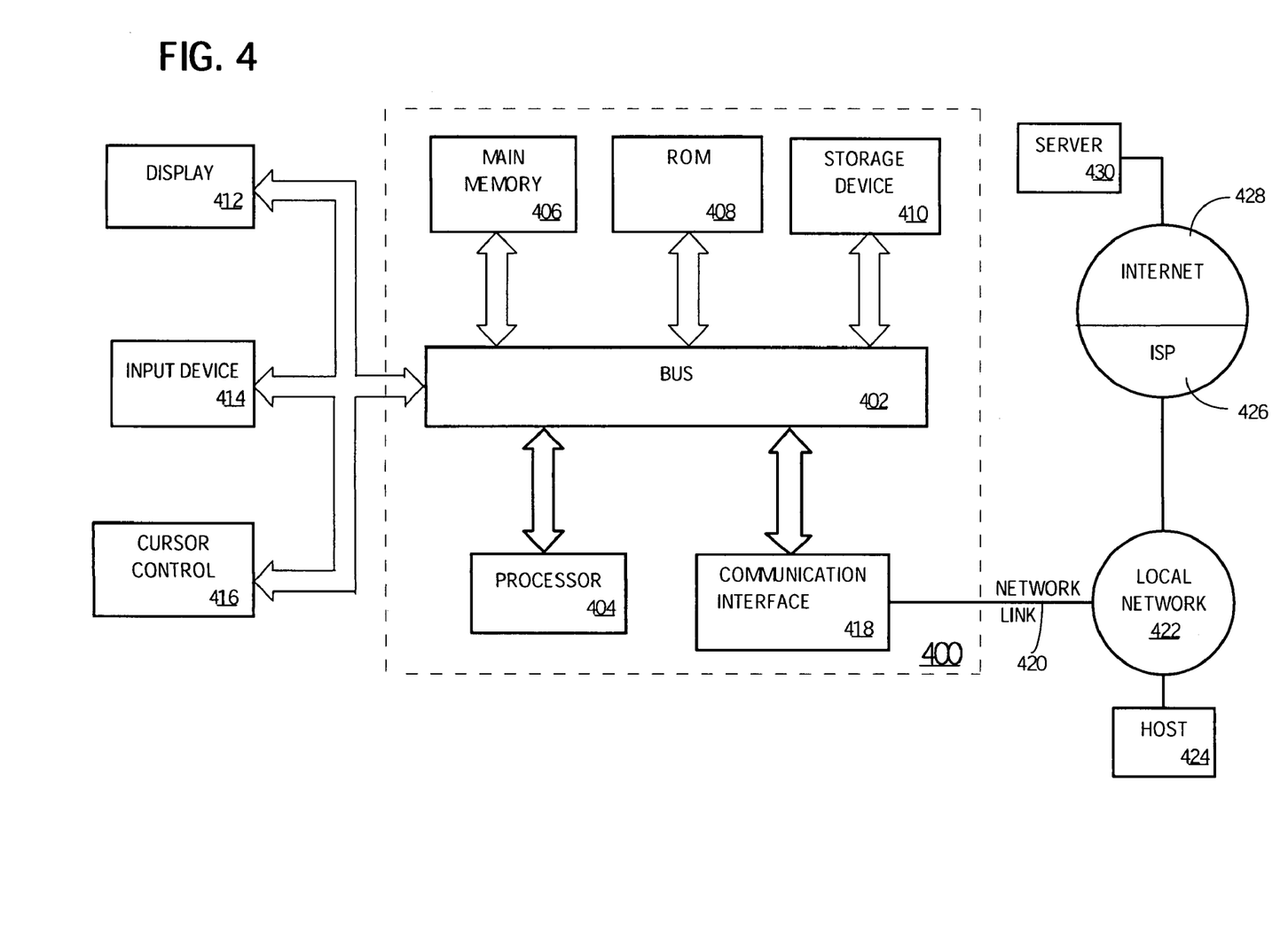
FIG. 4 is a block diagram that illustrates a computer system upon which an embodiment of the invention may be implemented.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 410. Volatile media includes dynamic memory, such as main memory 406. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for converting a process-specific schematic of an analog circuit to a process-independent schematic of the analog circuit, comprising:
receiving a parameter value for a device parameter of an analog device defined in a process-specific schematic;
for the device parameter:
selecting a shadow parameter from a process-independent schema library;
wherein selecting the shadow parameter includes:
identifying a shadow device, within the process-independent schema library, that corresponds to the analog device; and
determining which shadow parameter, of a plurality of shadow parameters specified for the shadow device in the process-independent schema library, corresponds to the device parameter defined in the process-specific schematic; and
deriving, based on the parameter value for the device parameter, a shadow parameter value for the shadow parameter;
wherein the shadow device corresponds to both the analog device defined in the process-specific schematic and to another analog device defined in a different process-specific schematic;
wherein the process-specific schematic and the different process-specific schematic are process-specific schematics for different process technologies;
storing, in the process-independent schematic, a definition of the analog circuit;
wherein the definition of the analog circuit includes:
data that represents the analog device; and
data that specifies that the shadow parameter is a parameter for the analog device; and
wherein, within the process-independent schematic, the definition of the analog circuit further includes data that specifies (1) the shadow parameter value; and (2) an association between the shadow parameter value and the shadow parameter;
wherein the process-independent schema library contains a corresponding shadow parameter for one or more device parameters of one or more analog devices defined in the process-specific schematic;
wherein the method is performed by one or more computing devices.

2. The method as recited in claim 1, wherein:
the process-specific schematic is associated with a configuration file; and
the steps of selecting a shadow parameter and deriving a shadow parameter value are performed based on information contained in the configuration file.

3. The method as recited in claim 1, wherein the process-specific schematic is a first process-specific schematic, and the method further comprises executing a conversion from the process-independent schematic of the analog circuit to a second process-specific schematic, wherein first process-specific schematic and the second process-specific schematic are for different process technologies.

4. The method as recited in claim 3, wherein executing the conversion from the process-independent schematic of the analog circuit to the second process-specific schematic comprises:
for the shadow parameter of the analog device defined in the process-independent schematic:
determining whether there is a corresponding parameter, in a process-specific schema library, that corresponds to the shadow parameter; and
in response to determining that there is a corresponding parameter in the process-specific schema library:
selecting the corresponding parameter; and
deriving, based on the shadow parameter value associated with the shadow parameter, a corresponding parameter value for the corresponding parameter;

storing, in the second process-specific schematic, a second definition of the analog circuit;
wherein the definition of the analog circuit stored in the process-independent schematic is a first definition;
wherein the second definition of the analog circuit includes data that represents the analog device and data that specifies the corresponding parameter; and
wherein the definition of the analog circuit further includes data that specifies (1) the corresponding parameter value; and (2) an association between the corresponding parameter value and the corresponding parameter;
wherein the process-specific library is associated with the second process-specific schematic.

5. The method as recited in claim 4, wherein:
the first process-specific schematic is associated with a first configuration file;
the steps of selecting a shadow parameter and deriving a shadow parameter value are performed based on information contained in the first configuration file;
the second process-specific schematic is associated with a second configuration file; and
the steps of determining whether there is a corresponding parameter, selecting the corresponding parameter, and deriving a corresponding parameter value are performed based on information contained in the second configuration file.

6. A method for displaying a process-independent schematic of an analog circuit as a process-specific schematic, comprising:
receiving input indicating user intent to display an analog device in the process-specific schematic;
accessing the process-independent schematic;
wherein the process-independent schematic defines the analog device;
wherein the process-independent schematic further specifies, for the analog device, one or more shadow parameters; and
wherein the process-independent schematic further specifies, for each the shadow parameter of the one or more shadow parameters, a shadow parameter value associated with the each shadow parameter;
for a shadow parameter of the analog device:
determining whether there is a corresponding parameter, in a process-specific schema library, that corresponds to the shadow parameter;
in response to determining that there is a corresponding parameter in the process-specific schema library:
deriving, based on the shadow parameter value associated with the shadow parameter, a corresponding parameter value for the corresponding parameter;
wherein the corresponding parameter value is different than the shadow parameter value; and
generating display data, wherein the display data includes data for displaying the analog device, data for displaying the corresponding parameter as a device parameter of the analog device, and data for displaying the corresponding parameter value as a device parameter value associated with the device parameter;
wherein the method is performed by one or more computing devices.

7. The method of claim 6, wherein the process-specific schema library is associated with the process-specific schematic.

8. The method of claim 6, wherein the process-independent schematic defines at least one shadow parameter for the analog device that does not correspond to any corresponding parameters in the process-specific schema library.

9. The method as recited in claim 6, wherein the input indicates user intent to display all analog devices defined in the process-independent schematic.

10. The method as recited in claim 6, wherein the input further indicates user intent to display all device parameters and associated device parameter values of the analog device.

11. The method as recited in claim 6, wherein the input is a first input and wherein the analog device is a first analog device, the method further comprising:
receiving a second input that indicates user intent to change a device parameter value associated with a device parameter of a second analog device in the process-specific schematic to a new device parameter value;
in response to receiving the second input,
selecting a new shadow parameter from a process-independent schema library; and
deriving, based on the device parameter value associated with the device parameter of the second analog device, a new shadow parameter value for the new shadow parameter;
storing, in the process-independent schematic, a definition of the analog circuit;
wherein the definition of the analog circuit includes data that represents the second analog device and data that specifies the new shadow parameter for the second analog device;
and
wherein the definition of the analog circuit further includes data that specifies (1) the new shadow parameter value; and (2) an association between the new shadow parameter value and the new shadow parameter.

12. The method as recited in claim 6, wherein
the process-specific schematic is associated with a configuration file; and
the steps of selecting a corresponding parameter and deriving a corresponding parameter value are performed based on information contained in the configuration file.

13. A non-transitory computer-readable storage medium storing instructions for converting a process-specific schematic of an analog circuit to a process-independent schematic of the analog circuit, wherein the instructions include instructions which, when executed by one or more processors, cause the one or more processors to perform steps of:
receiving a parameter value for a device parameter of an analog device defined in a process-specific schematic;
for the device parameter:
selecting a shadow parameter from a process-independent schema library;
wherein selecting the shadow parameter includes:
identifying a shadow device, within the process-independent schema library, that corresponds to the analog device; and
determining which shadow parameter, of a plurality of shadow parameters specified for the shadow device in the process-independent schema library, corresponds to the device parameter defined in the process-specific schematic; and
deriving, based on the parameter value for the device parameter, a shadow parameter value for the shadow parameter;

wherein the shadow device corresponds to both the analog device defined in the process-specific schematic and to another analog device defined in a different process-specific schematic;
wherein the process-specific schematic and the different process-specific schematic are process-specific schematics for different process technologies;
storing, in the process-independent schematic, a definition of the analog circuit;
    wherein the definition of the analog circuit includes:
        data that represents the analog device; and
        data that specifies one or mere that the shadow parameter is a parameter for the analog device;
    and
    wherein, within the process-independent schematic, the definition of the analog circuit further includes data that specifies (1) the shadow parameter value; and (2) an association between the shadow parameter value and the shadow parameter;
wherein the process-independent schema library contains a corresponding shadow parameter for one or more device parameters of one or more analog devices defined in the process-specific schematic.

14. The non-transitory computer-readable storage medium as recited in claim 13, wherein:
    the process-specific schematic is associated with a configuration file; and
    the instructions for selecting a shadow parameter and deriving a shadow parameter value include instructions for selecting a shadow parameter and deriving a shadow parameter value based on information contained in the configuration file.

15. The non-transitory computer-readable storage medium as recited in claim 13, wherein the process-specific schematic is a first process-specific schematic, and the instructions further comprises instructions for executing a conversion from the process-independent schematic of the analog circuit to a second process-specific schematic, wherein first process-specific schematic and the second process-specific schematic are for different process technologies.

16. The non-transitory computer-readable storage medium as recited in claim 15, wherein the instructions for executing the conversion from the process-independent schematic of the analog circuit to the second process-specific schematic comprises instructions for:
    for the shadow parameter of the analog device defined in the process-independent schematic:
        determining whether there is a corresponding parameter, in a process-specific schema library, that corresponds to the shadow parameter; and
        in response to determining that there is a corresponding parameter in the process-specific schema library:
            selecting the corresponding parameter; and
            deriving, based on the shadow parameter value associated with the shadow parameter, a corresponding parameter value for the corresponding parameter;
    storing, in the second process-specific schematic, a second definition of the analog circuit;
        wherein the definition of the analog circuit stored in the process-independent schematic is a first definition;
        wherein the second definition of the analog circuit includes data that represents the analog device and data that specifies the corresponding device parameter for the analog device;
        and
        wherein the definition of the analog circuit further includes data that specifies (1) the corresponding parameter value; and (2) an association between the corresponding parameter value and the corresponding parameter;
wherein the process-specific library is associated with the second process-specific schematic.

17. The non-transitory computer-readable storage medium as recited claim 16, wherein:
    the first process-specific schematic is associated with a first configuration file;
    the instructions for selecting a shadow parameter and deriving a shadow parameter value include instructions for selecting a shadow parameter and deriving a shadow parameter value based on information contained in the first configuration file;
    the second process-specific schematic is associated with a second configuration file; and
    the instructions for determining whether there is a corresponding parameter, selecting the corresponding parameter, and deriving a corresponding parameter value include instructions for determining whether there is a corresponding parameter, selecting the corresponding parameter, and deriving a corresponding parameter value based on information contained in the second configuration file.

18. A non-transitory computer-readable storage medium storing instructions for displaying a process-independent schematic of an analog circuit as a process-specific schematic, wherein the instructions include instructions which, when executed by one or more processors, cause the one or more processors to perform steps of:
    receiving input indicating user intent to display an analog device in the process-specific schematic;
    accessing the process-independent schematic;
        wherein the process-independent schematic defines the analog device;
        wherein the process-independent schematic further specifies, for the analog device, one or more shadow parameters; and
        wherein the process-independent schematic further specifies, for each shadow parameter of the one or more shadow parameters, a shadow parameter value associated with the each shadow parameter;
    for a shadow parameter of the analog device:
        determining whether there is a corresponding parameter, in a process-specific schema library, that corresponds to the shadow parameter;
        in response to determining that there is a corresponding parameter in the process-specific schema library:
            deriving, based on the shadow parameter value associated with the shadow parameter, a corresponding parameter value for the corresponding parameter;
            wherein the corresponding parameter value is different than the shadow parameter value; and
            generating display data, wherein the display data includes data for displaying the analog device, data for displaying the corresponding parameter as a device parameter of the analog device, and data for displaying the corresponding parameter value as a device parameter value associated with the device parameter.

19. The non-transitory computer-readable storage medium of claim 18, wherein the process-specific schema library is associated with the process-specific schematic.

20. The non-transitory computer-readable storage medium of claim 18, wherein the process-independent schematic defines at least one shadow parameter for the analog device that does not correspond to any corresponding parameters in the process-specific schema library.

21. The non-transitory computer-readable storage medium as recited in claim 18, wherein the input indicates user intent to display all analog devices defined in the process-independent schematic.

22. The non-transitory computer-readable storage medium as recited in claim 18, wherein the input further indicates user intent to display all device parameters and associated device parameter values of the analog device.

23. The non-transitory computer-readable storage medium as recited in claim 18, wherein the input is a first input and wherein the analog device is a first analog device, further comprising instructions for:

receiving a second input that indicates user intent to change a device parameter value associated with a device parameter of a second analog device in the process-specific schematic to a new device parameter value;

in response to receiving the second input, selecting a new shadow parameter from a process-independent schema library; and deriving, based on the device parameter value associated with the device parameter of the second analog device, a new shadow parameter value for the new shadow parameter;

storing, in the process-independent schematic, a definition of the analog circuit;

wherein the definition of the analog circuit includes data that represents the second analog device and data that specifies the new shadow parameter for the second analog device;

and wherein the definition of the analog circuit further includes data that specifies (1) the new shadow parameter value; and (2) an association between the new shadow parameter value and the new shadow parameter.

24. The non-transitory computer-readable storage medium as recited in claim 18, wherein the process-specific schematic is associated with a configuration file; and the instructions for selecting a corresponding parameter and deriving a corresponding parameter value comprises instructions for selecting a corresponding parameter and deriving a corresponding parameter value based on information contained in the configuration file.

* * * * *